United States Patent
Wang et al.

(10) Patent No.: US 10,325,959 B2
(45) Date of Patent: Jun. 18, 2019

(54) PIXEL STRUCTURE HAVING COMMON SUB-PIXELS AND OLED DISPLAY PANEL

(71) Applicant: KUNSHAN GO-VISIONOX OPTO-ELECTRONICS CO., LTD., KunShan, Jiangsu (CN)

(72) Inventors: Xuliang Wang, KunShan (CN); Shuaiyan Gan, KunShan (CN); Xiaozhao Zhu, KunShan (CN); Weili Li, KunShan (CN); Xiujian Zhu, KunShan (CN)

(73) Assignee: KUNSHAN GO-VISIONOX OPTO-ELECTRONICS CO., LTD., Jiangsu (CN)

( * ) Notice: Subject to any disclaimer, the term of this patent is extended or adjusted under 35 U.S.C. 154(b) by 0 days.

(21) Appl. No.: 15/755,790

(22) PCT Filed: Sep. 1, 2016

(86) PCT No.: PCT/CN2016/097763
§ 371 (c)(1),
(2) Date: Feb. 27, 2018

(87) PCT Pub. No.: WO2017/054614
PCT Pub. Date: Apr. 6, 2017

(65) Prior Publication Data
US 2019/0035861 A1      Jan. 31, 2019

(30) Foreign Application Priority Data

Aug. 31, 2015   (CN) .......................... 2015 1 0547675
Sep. 9, 2015    (CN) .......................... 2015 1 0570088

(51) Int. Cl.
    H01L 27/32      (2006.01)
    H01L 27/12      (2006.01)
(Continued)

(52) U.S. Cl.
    CPC ........ *H01L 27/3211* (2013.01); *G09G 3/2003* (2013.01); *G09G 3/3648* (2013.01);
(Continued)

(58) Field of Classification Search
    CPC ............. H01L 27/3211; H01L 27/3216; H01L 27/3218; H01L 27/3213
    See application file for complete search history.

(56) References Cited

U.S. PATENT DOCUMENTS

2014/0071030 A1    3/2014  Lee
2015/0077447 A1    3/2015  Zhang
(Continued)

FOREIGN PATENT DOCUMENTS

CN      103311266 A     9/2013
CN      104037200 A     9/2014
(Continued)

*Primary Examiner* — Quoc D Hoang
(74) *Attorney, Agent, or Firm* — Muncy, Geissler, Olds & Lowe, P.C.

(57) ABSTRACT

A pixel structure and an organic light-emitting diode (OLED) display panel incorporating the pixel structure are disclosed. Each pixel unit (110) in the pixel structure includes a first sub-pixel (111), a second sub-pixel (112), a third sub-pixel (113) and two fourth sub-pixels (114). The second sub-pixel (112), the third sub-pixel (113) and the fourth sub-pixels (114) are arranged to define a quadrilateral encompassing the first sub-pixel (111) and be common to four adjacent pixel units (110). The first sub-pixel (111) serves as a primary display element, while each of the second sub-pixel (112), the third sub-pixel (113) and the fourth sub-pixels (114) acts as a secondary display element. As a result, a higher aperture ratio of the primary display element can be obtained at the same PPI and design margin, or an increased design margin and reduced process difficulty can be obtained at the same PPI and aperture ratio.

10 Claims, 5 Drawing Sheets

(51) Int. Cl.
*G09G 3/20* (2006.01)
*G09G 3/36* (2006.01)

(52) U.S. Cl.
CPC ............. *H01L 27/12* (2013.01); *H01L 27/32* (2013.01); *H01L 27/322* (2013.01); *H01L 27/3213* (2013.01); *H01L 27/3218* (2013.01); *G09G 2300/0452* (2013.01); *H01L 27/3216* (2013.01)

(56) References Cited

U.S. PATENT DOCUMENTS

| | | |
|---|---|---|
| 2015/0091785 A1 | 4/2015 | Lee |
| 2015/0311264 A1* | 10/2015 | Shen .................. H01L 27/3218 257/40 |
| 2016/0019832 A1* | 1/2016 | Nakanishi ............... G09G 5/02 345/690 |

FOREIGN PATENT DOCUMENTS

| | | |
|---|---|---|
| CN | 104037202 A | 9/2014 |
| CN | 104465714 A | 3/2015 |
| CN | 104576695 A | 4/2015 |
| CN | 104766563 A | 7/2015 |
| CN | 204885166 U | 12/2015 |
| EP | 2637209 A1 | 9/2013 |
| EP | 5873749 A2 | 5/2015 |
| JP | 2004-507773 A | 3/2004 |
| JP | 2013-187187 A | 9/2013 |
| JP | 2014-056819 A | 3/2014 |
| JP | 2014-157207 A | 8/2014 |
| JP | 2015-095456 A | 5/2015 |
| TW | 200627367 A | 8/2006 |
| TW | 201027729 A1 | 7/2010 |

* cited by examiner

PIXEL STRUCTURE HAVING COMMON SUB-PIXELS AND OLED DISPLAY PANEL

TECHNICAL FIELD

The present invention relates to the field of display technology and, in particular, to a pixel structure and an organic light-emitting diode (OLED) display panel incorporating the pixel structure.

BACKGROUND

Organic light-emitting diode (OLED) display panels are considered to have the most potential to be the next generation of new flat panel display technology thanks to their wide variety of outstanding advantages including active illumination, thinness, a large viewing angle, fast response, good energy-saving performance, a wide temperature tolerance range and capabilities of flexible and transparent display.

Currently, there are two well developed full-color techniques for OLED display panels: color filters (CF) and RGB (the three primary colors: red, green and blue) pixels.

Like those used in liquid crystal display (LCD) panels, color filters can also be used in OLED display panels for the full-color effect. In these cases, white-light OLEDs serve as backlight playing the same role as both backlight and liquid crystal molecules in LCD panels, and color filters are placed thereon to form red, green and blue sub-pixels. In this way, the resolution and large panel requirements can be satisfied. However, as light loses significant energy when passing through the color filters, such display panels suffer from significant power consumption.

In order to address the high power consumption issue, full-color OLED display panels using RGB pixels have been utilized.

FIG. 1 schematically illustrates an existing OLED display panel utilizing RGB pixels. As shown in FIG. 1, the OLED display panel is formed in a paralleled RGB manner and has multiple pixel units Pixel each including, horizontally aligned, one red sub-pixel unit R, one green sub-pixel unit G and one blue sub-pixel unit B. The sub-pixel units in the OLED display panel are arranged in a matrix and each of them has a display section 1 and a non-display section 2. Specifically, the display section 1 of each sub-pixel unit is provided with a cathode, an anode and an electroluminescent layer (organic emission layers) disposed between the cathode and the anode to generate light of the prescribed color so as to enable the display of an image. The electroluminescent layer is usually fabricated by vapor deposition. During the fabrication of the conventional display panel, three vapor deposition processes are carried out to form electroluminescent layers for the corresponding colors (red, green and blue) in the display sections 1 of the pixel units.

FIG. 2 schematically illustrates another existing OLED display panel utilizing RGB pixels. As shown in FIG. 2, the OLED display panel formed in an RGB matrix manner has multiple pixel units Pixel each including one red sub-pixel unit R, one green sub-pixel unit G and one blue sub-pixel unit B. Two out of these three sub-pixel units, for example, the red sub-pixel unit R and the green sub-pixel unit G, are arranged in a column, and the third sub-pixel unit, for example, the blue sub-pixel unit B, is disposed in another column. As such, the sub-pixel units in the OLED display panel are arranged in a matrix.

As technology evolves, users are increasingly demanding for OLED display panels with higher resolution, and the conventional RGB pixel arrangements have fallen short in meeting the increasingly higher PPI (pixels per inch) requirements.

SUMMARY OF THE INVENTION

The present invention provides a pixel structure, comprising a plurality of pixel units arranged in an array, each pixel unit comprising a first sub-pixel, a second sub-pixel, a third sub-pixel and two fourth sub-pixels. The second, third and fourth sub-pixels are arranged to define a quadrilateral encompassing the first sub-pixel, and the second, third and fourth sub-pixels be common to four adjacent ones of the pixel units.

In one embodiment, the second and third sub-pixels may be located at two opposing apexes of the quadrilateral and the two fourth sub-pixels are located at the other two opposing apexes of the quadrilateral. Additionally, the first sub-pixel may reside on a line segment connecting centers of adjacent second and third sub-pixels, and/or the first sub-pixel resides on a line segment connecting centers of adjacent two fourth sub-pixels.

In one embodiment, the first, second, third and fourth sub-pixels may all be polygons.

In one embodiment, the first, second, third and fourth sub-pixels may be quadrilaterals, hexagons, octagons or any combination thereof.

In one embodiment, the first sub-pixel may be a rectangle, with each of the second, third and fourth sub-pixels being a square.

In one embodiment, the short sides of the first sub-pixel may be parallel to the line segment connecting the centers of the adjacent second and third sub-pixels, while its long sides extend parallel to the line segment connecting the centers of the adjacent two fourth sub-pixels. Alternatively, the short sides of the first sub-pixel may be perpendicular to the line segment connecting the centers of the adjacent second and third sub-pixels, while its long sides are perpendicular to the line segment connecting the centers of the adjacent two fourth sub-pixels.

In one embodiment, the first, second, third and fourth sub-pixels in one pixel unit may be symmetric to corresponding ones in an adjacent pixel unit.

In one embodiment, the first, second, third and fourth sub-pixels may emit light of distinct colors.

The present invention also provides OLED display panel comprising a pixel structure as defined above.

In order to solve the problem described above, the present invention provides a pixel structure for use in an OLED display panel, in which each pixel unit includes a first sub-pixel, a second sub-pixel, a third sub-pixel and two fourth sub-pixels. The second, third and fourth sub-pixels all function as secondary display elements and are common to four adjacent pixel units and arranged to define a quadrilateral encompassing the first sub-pixel which acts as a primary display element. As a result, a higher aperture ratio of the primary display element can be obtained at the same PPI and design margin, or an increased design margin and reduced process difficulty can be obtained at the same PPI and aperture ratio.

DETAILED DESCRIPTION

Figure 1:
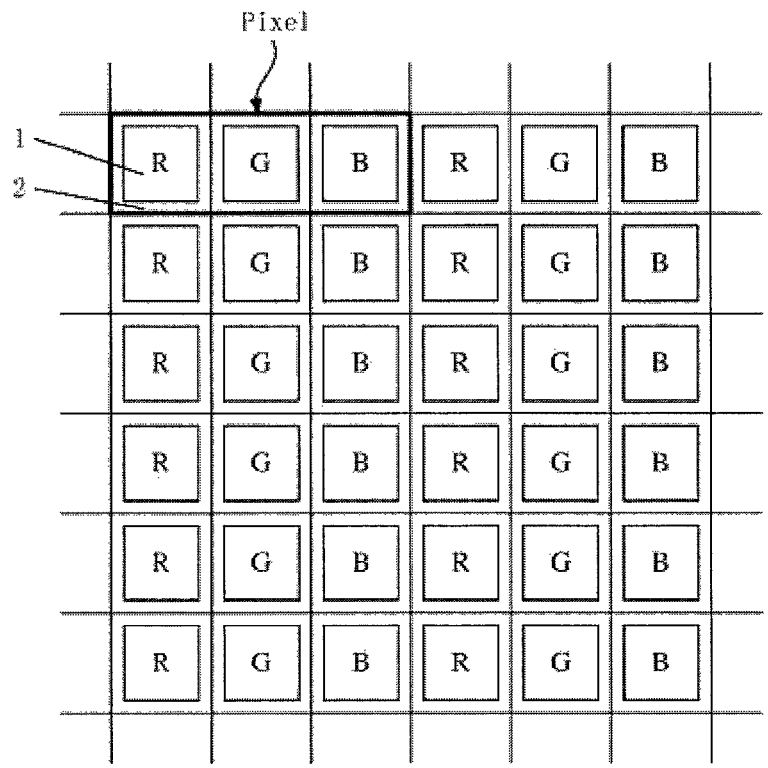
FIG. 1 schematically illustrates part of a pixel structure in an existing OLED display panel.
Figure 2:
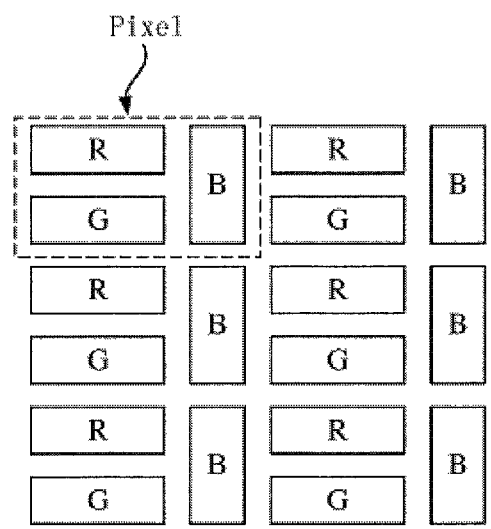
FIG. 2 schematically illustrates part of a pixel structure in another existing OLED display panel.

As described in the Background section, the conventional RGB pixel arrangements have fallen short in meeting the increasingly higher PPI requirements. In view of this, it is proposed in the present invention a pixel structure for an organic light-emitting diode (OLED) display panel, comprising a plurality of pixel units arranged in an array, each including a first sub-pixel, a second sub-pixel, a third sub-pixel and two fourth sub-pixels. The second, third and fourth sub-pixels define a quadrilateral encompassing the first sub-pixel (i.e., the first sub-pixel is within the quadrilateral) and are common to four adjacent pixel units. The first sub-pixel is a primary display element, while the second, third and fourth sub-pixels are secondary display elements. This arrangement allows a higher aperture ratio of the sub-pixels acting as the primary display elements and a longer life span of them at the same PPI and design margin, or an increased design margin, reduced process difficulty and an improved yield at the same PPI and aperture ratio.

Presented above is the basis concept of the present application. The subject matter of specific embodiments of the present invention will be fully described with reference to the drawings accompanying the embodiments so that it will be more apparent. Obviously, the disclosed embodiments are only some rather than all embodiments of the invention. All other embodiments made by those of ordinary skill in the art based on the embodiments disclosed herein without inventive efforts fall within the scope of the present invention.

Although numerous specific details are set forth below to facilitate a thorough understanding of the present invention, the invention can also be implemented in other ways than those described herein and those skilled in the art can make similar forms thereof without departing from the spirit of the present invention. Therefore, the present invention is not limited to the specific embodiments disclosed below.

The present invention will be described in detail with reference to the accompanying drawings. In order to facilitate the following detailed description, the sectional views of the device structure may not be drawn to scale with parts showing some elements being enlarged. These schematics are provided merely for example and shall not be deemed as limiting the scope of the invention. Further, in practical fabrication, three-dimensional dimensions of the components, i.e., their lengths, widths and depths shall also be taken into account.

The pixel structure and the OLED display panel incorporating the pixel structure will be described in details with reference to the embodiments described below. For the sake of clarity and brevity, the positions of the sub-pixels are described with respect to their centers. However, the present invention is not limited to this, and it is to be understood by those skilled in the art that the positions of the sub-pixels may also be described with respect to their apexes or other references.

Embodiment 1

Figure 3:
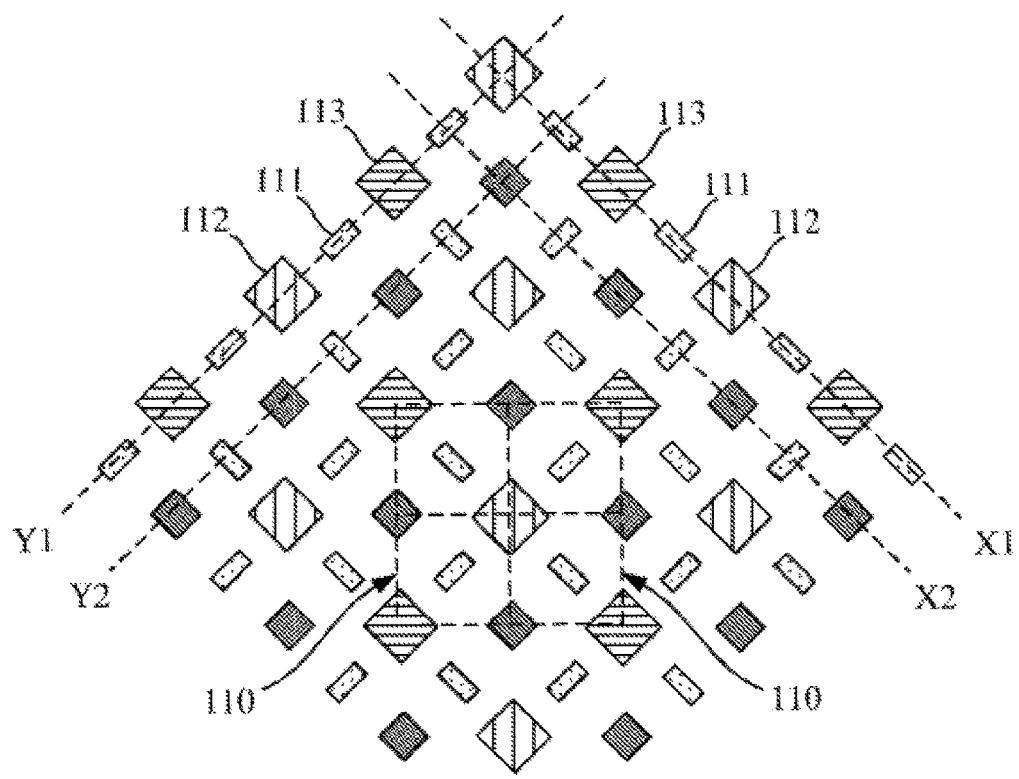
FIG. 3 is a schematic showing part of a pixel structure in an OLED display panel according to a first embodiment of the present invention.
Figure 4:
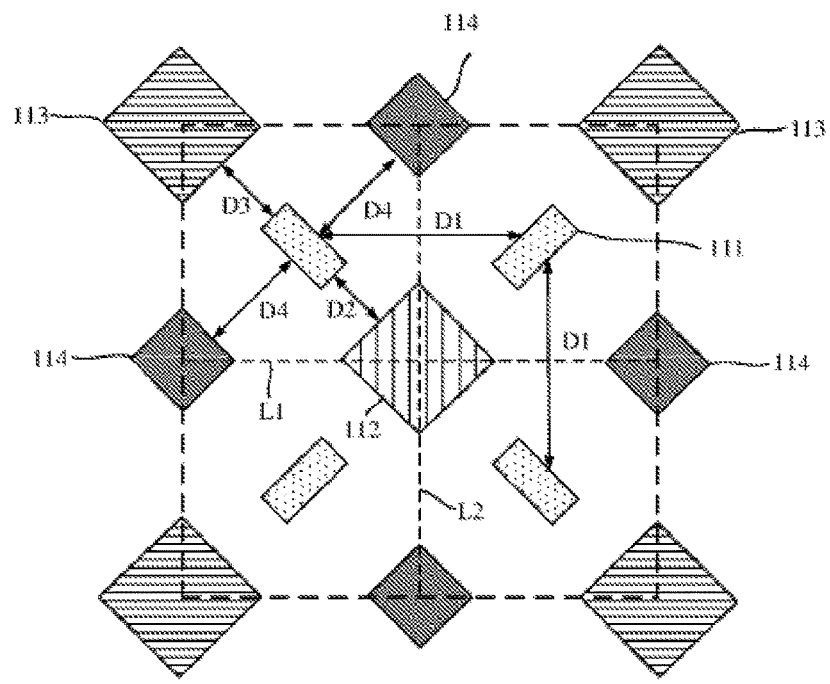
FIG. 4 is a schematic illustration of four pixel units in the pixel structure of FIG. 3.
Figure 5:
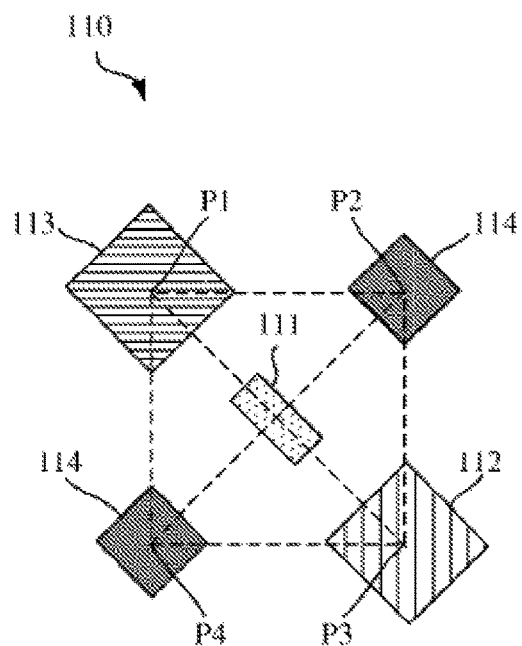
FIG. 5 is a schematic illustration of one pixel unit in the pixel structure of FIG. 3.

FIG. 3 is a schematic illustrating part of a pixel structure in an OLED display panel according to a first embodiment of the present invention. FIG. 4 is a schematic illustration of four pixel units in the pixel structure of FIG. 3. FIG. 5 is a schematic illustration of one pixel unit in the pixel structure of FIG. 3.

As shown in FIGS. 3 to 5, the pixel structure of the OLED display panel includes a plurality of pixel units 110 arranged in an array, each comprising five sub-pixels including a first sub-pixel 111, a second sub-pixel 112, a third sub-pixel 113 and two fourth sub-pixels 114. The first sub-pixel 111 is dedicated to the specific pixel unit 110, while the second sub-pixel 112, the third sub-pixel 113 and the fourth sub-pixels 114 are common to the four adjacent pixel units. The first sub-pixel 111 is a primary display element and its PPI represents the PPI of the display device. The rest four sub-pixels all serve as secondary display elements configured only for coloring without contribution to lighting and can therefore be made smaller than their traditional counterparts, saving more space for the primary display element. This arrangement enables, on the one hand, an increased aperture ratio of the sub-pixels and hence a longer life span of them at the same PPI and design margin, and on the other hand, an increased design margin and reduced process difficulty at the same PPI and aperture ratio because the size-reduced sub-pixels acting as the secondary display elements allow greater pixel-to-pixel spacings favorable to the reliability of organic emission layer deposition processes utilizing fine metal masks.

The second sub-pixel 112, the third sub-pixel 113 and the two fourth sub-pixels 114 define a quadrilateral, for example, a square as indicated by the square dashed box in FIG. 5. The second sub-pixel 112 and the third sub-pixel 113 are located at two opposing corners P1, P3 of the quadrilateral (i.e., two apexes on a diagonal of the quadrilateral), while the two fourth sub-pixels 114 are situated at the other two opposing corners P2, P4 of the quadrilateral (i.e., the two apexes on the other diagonal thereof). The second sub-pixel 112, the third sub-pixel 113 and the fourth sub-pixels 114 surround the first sub-pixel 111. That is, the first sub-pixel 111 is within the quadrilateral.

With emphasized reference to FIG. 5, in this embodiment, the first sub-pixel 111 is located on the midpoint of a line segment connecting the nearest second sub-pixel 112 and third sub-pixel 113 and also on the midpoint of a line segment connecting the nearest two fourth sub-pixels 114. In other words, the first sub-pixel 111 resides right at the center of the square dashed box. It is a matter of course that the first sub-pixel 111 is not limited to this location, and for example, it may be not located on the line segment connecting the nearest second sub-pixel 112 and the third sub-pixel 113 or not located on the line segment connecting the nearest fourth sub-pixels 114. In fact, the first sub-pixel 111 may be located any other position in the quadrilateral than the center thereof.

In this embodiment, the first, second, third and fourth sub-pixel 111, 112, 113, 114 in the pixel structure each assume a quadrilateral shape. In particular, the first sub-pixel 111 is a rectangle, while each of the second, third and fourth sub-pixel 112, 113, 114 is a square. Further, the long sides of the first sub-pixel 111 are oriented parallel to the line segment connecting centers of the nearest second and third sub-pixel 112, 113, and its short sides extend parallel to the line segment connecting the two adjacent fourth sub-pixels 114.

Furthermore, every two adjacent imaginary square boxes have a common side, for example, the imaginary sides L1, L2 in FIG. 4. The first sub-pixels 111 of every two adjacent pixel units are in mirror symmetry with respect to the common side of the two corresponding imaginary square boxes, on which centers of the second sub-pixel 112 and the fourth sub-pixel 114 both nearest to both of the first sub-pixels 111 are located. Herein, the phase "mirror symmetry" means that the two first sub-pixels 111 are of the same shape but oriented toward different directions. Every two adjacent second sub-pixels 112 are in exact symmetry with respect to a line segment connecting centers of the two third sub-pixels 113 both nearest to both of the specific second sub-pixels 112, every two adjacent third sub-pixel 113 are in exact symmetry with respect to a line segment connecting centers of the two second sub-pixel 112 both nearest to both of the specific third sub-pixel 113, and every two adjacent fourth sub-pixels 114 are in exact symmetry with respect to a line segment connecting centers of the second sub-pixel 112 and third sub-pixel 113 both nearest to both of the specific fourth sub-pixels 114. Here, the phrase "exact symmetry" means that the two sub-pixels are identical to each other in terms of shape and orientation.

While the first, second, third and fourth sub-pixels 111, 112, 113, 114 have been described above as each having a quadrilateral shape as an example, it is to be noted that in other embodiments of the present invention, the first, second, third and fourth sub-pixels 111, 112, 113, 114 may also have one or more of many other polygonal shapes such as triangular, pentagonal, hexagonal, heptagonal and octagonal, and the long sides of the first sub-pixel 111 may also not be parallel to the line segment connecting the centers of the second and third sub-pixels 112, 113 and, for example, form a certain angle therewith.

With continued reference to FIGS. 4 and 5, in this embodiment, the second and third sub-pixels 112, 113 have the same area, the fourth sub-pixels 114 each have an area smaller than the area of the second and third sub-pixels 112, 113, and the first sub-pixel 111 has an area smaller than the area of the fourth sub-pixels 114. In this embodiment, the first sub-pixel 111 has the smallest area among the other sub-pixels due to the consideration that each of the other sub-pixels is common to the four adjacent pixel units. However, it is noted that the present invention is not limited to any specific area of any of the sub-pixels, and the first, second, third and fourth sub-pixels 111, 112, 113, 114 may have the same area or not, and their areas may be adjusted according to the specific coloring requirements.

As shown in FIG. 4, the first sub-pixel 111 is spaced apart from each adjacent first sub-pixel 111 by a distance D1, from the second sub-pixel 112 by a distance D2, from the third sub-pixel 113 by a distance D3, and from each of the fourth sub-pixels 114 by a distance D4. The first sub-pixel 111 serves as a primary display element, and the second, third and fourth sub-pixels 112, 113, 114 all function as secondary display elements that are configured only for coloring without contribution to lighting and can therefore be made smaller than their traditional counterparts, saving more space for the primary display element. At the same PPI and aperture ratio as the traditional arrangements, shrinkage of the sub-pixels serving as the secondary display elements enables increases in the distances between the sub-pixels, for example, D2, D3 and D4, the reliability of organic emission layer deposition processes utilizing fine metal masks can be improved. That is, the design margin of the panel device can be enhanced with reduced the process difficulty.

In this embodiment, in each odd-numbered row, the second and third sub-pixels 112, 113 are alternately arranged, for example, along the first imaginary line X1 in FIG. 3, with the first sub-pixels 111 interposed therebetween, and in each even-numbered row, the first and fourth sub-pixels 114 are alternately arranged, for example, along the second imaginary line X2 in FIG. 3. In addition, in each odd-numbered column, the second and third sub-pixels 112, 113 are alternately arranged, for example, along the first imaginary line Y1 in FIG. 3, with the first sub-pixels 111 interposed therebetween, and in each even-numbered column, the first and fourth sub-pixels 114 are alternately arranged, for example, along the second imaginary line Y2 in FIG. 3. In other embodiments of the present invention, the second and third sub-pixels 112, 113 may be transposed. In other words, in each odd-numbered row, the first and fourth sub-pixels 111, 114 are alternately arranged, and in each even-numbered row, the second and third sub-pixels 112, 113 are alternately arranged with the first sub-pixels 111 interposed therebetween. Additionally, in each odd-numbered column, the first and fourth sub-pixels 111, 114 are alternately arranged, and in each even-numbered column, the second and third sub-pixels 112, 113 are alternately arranged with the first sub-pixels 111 interposed therebetween. It is to be appreciated that FIG. 3 shows only part of the pixel structure in the OLED display panel for the sake of brevity, and the pixel structure may actually include more columns and/or more rows.

In one embodiment, the first sub-pixel 111 is adapted to emit yellow or white light and, to this end, includes an organic emission layer for emitting yellow or white light; the second sub-pixel 112 is adapted to emit red light and, to this end, includes an organic emission layer for emitting red light; the third sub-pixel 113 is adapted to emit blue light and, to this end, includes an organic emission layer for emitting blue light; and the fourth sub-pixels 114 are adapted to emit green light and, to this end, includes respective organic emission layers for emitting green light. It is to be appreciated that these light-emitting functions can be interchanged among the sub-pixels, provided that the first, second, third and fourth sub-pixels 111, 112, 113, 114 include at least sub-pixels for emitting red, green and blue light. In other words, the first, second, third and fourth sub-pixels 111, 112, 113, 114 may emit light of distinct colors, for example, yellow, red, green and blue, or white red, green and blue, as described above. Alternatively, it is also possible that the sub-pixels of two types emit light of the same color so that the first, second, third and fourth sub-pixels 111, 112, 113, 114 emit red, green and blue light. For example, the first and fourth sub-pixels 111, 114 emit green light while the second and third sub-pixel 112, 113 emit red and blue light, respectively. Similar embodiments are also possible and will not be described in detail herein for the sake of brevity.

Embodiment 2

Figure 6:
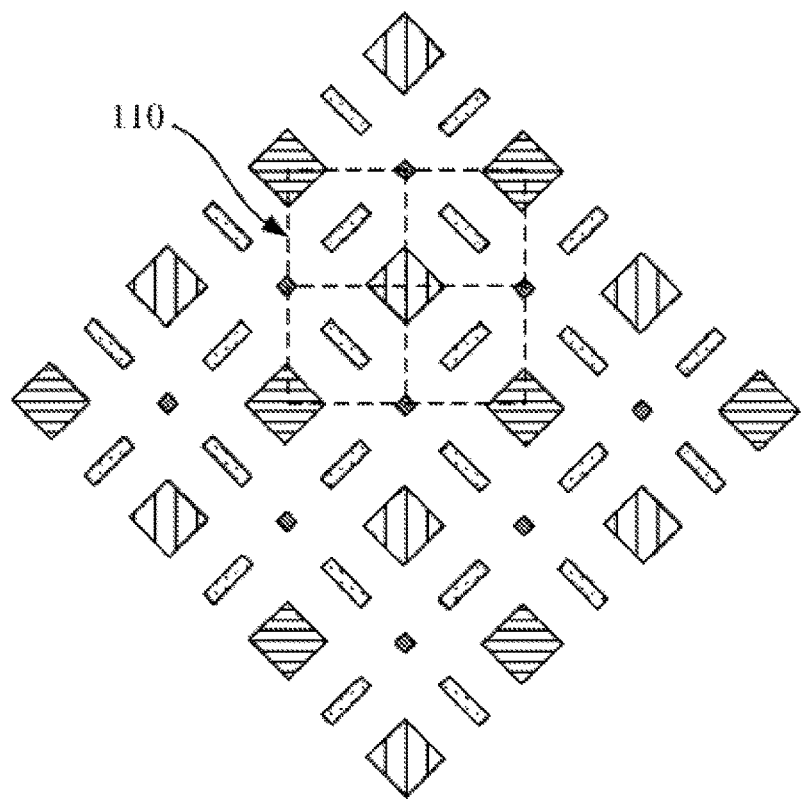
FIG. 6 is a schematic showing part of a pixel structure in an OLED display panel according to a second embodiment of the present invention.
Figure 7:
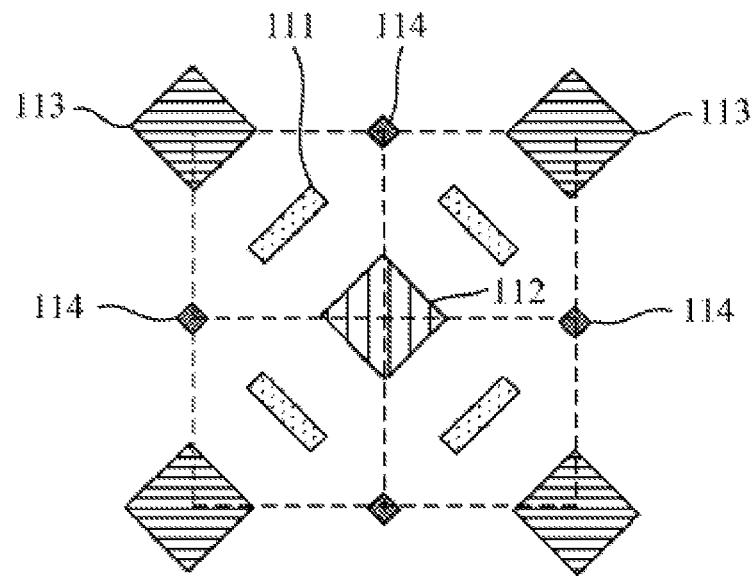
FIG. 7 is a schematic illustration of four pixel units in the pixel structure of FIG. 6.
Figure 8:
FIG. 8 is a schematic illustration of one pixel unit in the pixel structure of FIG. 6.
Figure 8:
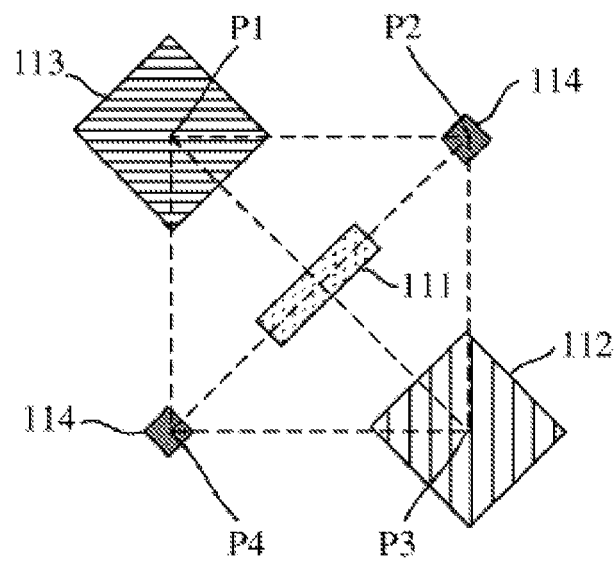

FIG. 6 is a schematic showing part of a pixel structure in an OLED display panel according to a second embodiment of the present invention. FIG. 7 is a schematic illustration of four pixel units in the pixel structure of FIG. 6. FIG. 8 is a schematic illustration of one pixel unit in the pixel structure of FIG. 6.

As shown in FIGS. 6 to 8, the pixel structure according to this embodiment includes a plurality of pixel units 110 arranged in an array, each comprising five sub-pixels including a first sub-pixel 111, a second sub-pixel 112, a third sub-pixel 113 and two fourth sub-pixels 114. The first sub-pixel 111 is dedicated to the specific pixel unit 110, while the second, third and fourth sub-pixels 112, 113, 114 are common to the four adjacent pixel units.

This embodiment differs from Embodiment 1 only in that the short sides of the first sub-pixel 111 are parallel to the line segment connecting the centers of the second and third sub-pixel 112, 113, with its long sides extending parallel to the line segment connecting the two fourth sub-pixels 114, as shown in FIG. 8.

In addition, in this embodiment, the second and third sub-pixels 112, 113 have the same area, the first sub-pixel 111 has an area smaller than the area of the second and third sub-pixels 112, 113, and the fourth sub-pixels 114 each have an area smaller than the area of the first sub-pixel 111.

Embodiment 3

Figure 9:
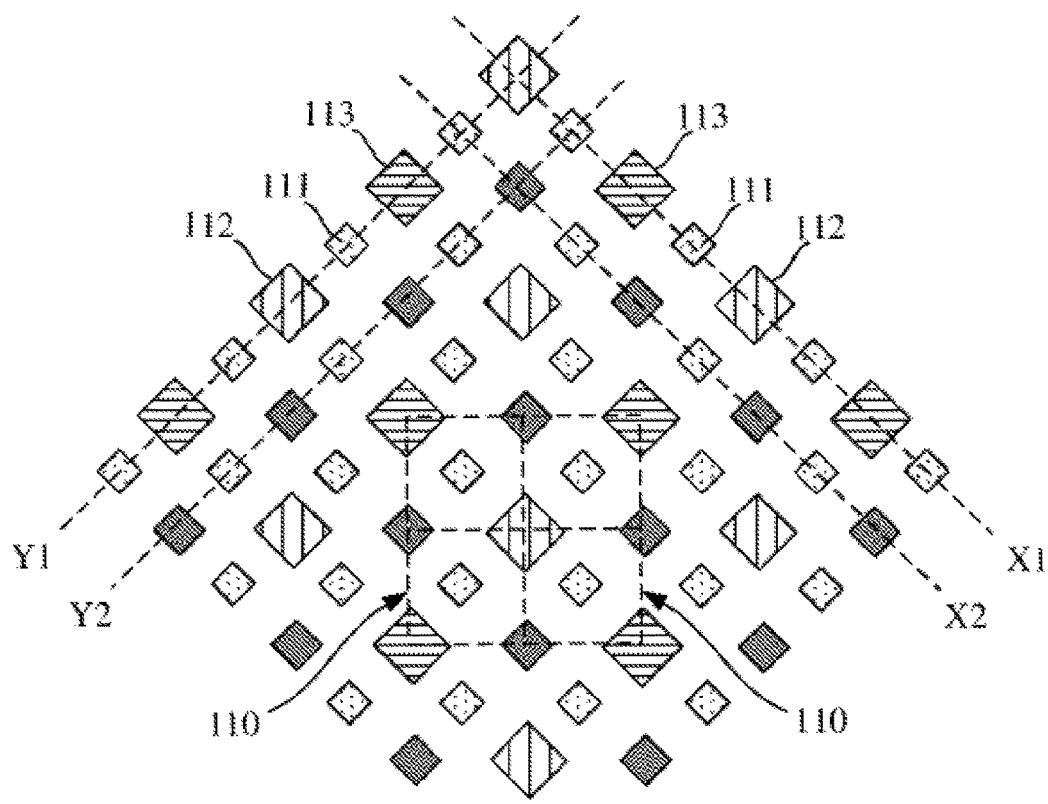
FIG. 9 is a schematic showing part of a pixel structure in an OLED display panel according to a third embodiment of the present invention.
Figure 10:
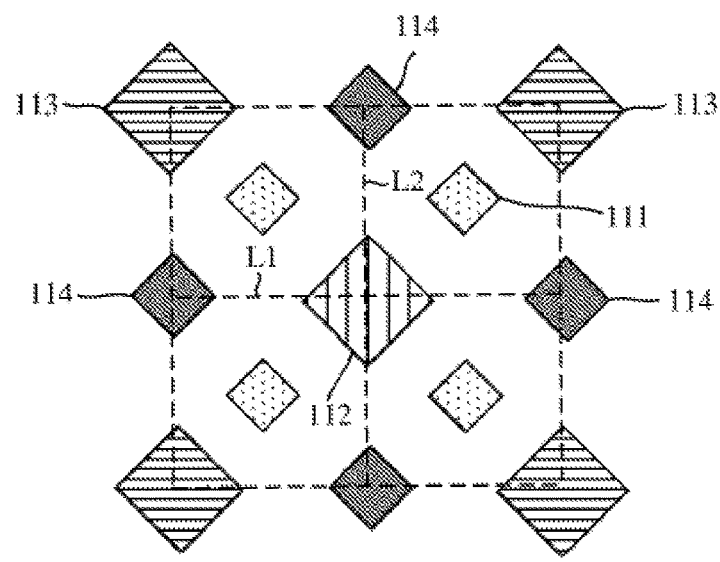
FIG. 10 is a schematic illustration of four pixel units in the pixel structure of FIG. 9.

FIG. 9 is a schematic showing part of a pixel structure in an OLED display panel according to a third embodiment of the present invention. FIG. 10 is a schematic illustration of four pixel units in the pixel structure of FIG. 9.

As shown in FIGS. 9 and 10, the pixel structure according to this embodiment includes a plurality of pixel units 110 arranged in an array, each comprising five sub-pixels including a first sub-pixel 111, a second sub-pixel 112, a third sub-pixel 113 and two fourth sub-pixels 114. The first sub-pixel 111 is dedicated to the specific pixel unit 110, while the second, third and fourth sub-pixels 112, 113, 114 are common to the four adjacent pixel units.

This embodiment differs from Embodiment 1 only in that the first, second, third and fourth sub-pixels 111, 112, 113, 114 are all squares and that the first, second, third and fourth sub-pixels 111, 112, 113, 114 are in exact symmetry with those in each adjacent pixel unit. Specifically, every two adjacent imaginary square boxes share a common side, for example, the imaginary side L1 or L2 in FIG. 10, and the first, second, third and fourth sub-pixels 111, 112, 113, 114 in one of the corresponding pixel units are in exact symmetry with those in the other corresponding pixel unit with respect to this common side, for example, the imaginary side L1 or L2.

Embodiment 4

An OLED display panel according to this embodiment incorporates the pixel structure according to Embodiment 1, 2 or 3.

In one embodiment, the first, second, third and fourth sub-pixels 111, 112, 113, 114 are provided with power lines for driving individual pixels, for example, gate lines, data lines, driving power lines, etc. In addition, they are also provided with insulating layers for limiting the individual sub-pixels, for example, pixel limiting layers. Further, in one embodiment, OLEDs for the individual first, second, third and fourth sub-pixels 111, 112, 113, 114 are included, each including an anode, an organic emission layer and a cathode. The shapes of the individual pixels are defined by the corresponding power lines, pixel limiting layers and anodes. This is well-known to those skilled in this art and will not be described in greater detail for the sake of brevity.

The organic emission layers in the pixels of the OLED display panel may be fabricated by deposition processes in which masks (e.g., fine metal masks (FMMs)) are used. Reducing the spacings between the pixels can lead to an increase in the aperture ratio of the pixels but a reduction in the reliability of the deposition processes. On the other hand, while greater pixel-to-pixel spacings can enhance the reliability of the deposition processes, they can lead to a lower aperture ratio of the pixels.

Different from the traditional RGB pixel arrangements, in the present invention, the second, third and fourth sub-pixels each acting as a secondary display element define a quadrilateral encompassing the first sub-pixel which serves as a primary display element. The secondary display elements are configured only for coloring while not contributing to lighting and can thus be reduced in size compared to their traditional counterparts to save more space for the primary display element. This arrangement can enable, on the one hand, a higher aperture ratio of the sub-pixels serving as the primary display elements and hence a longer service life of the OLED display panel at the same PPI and design margin, and on the other hand, an increased design margin and reduced process difficulty at the same PPI and aperture ratio because the size-reduced sub-pixels acting as the secondary display elements allow greater pixel-to-pixel spacings favorable to the reliability of organic emission layer deposition processes utilizing fine metal masks.

It is noted that the embodiments disclosed herein are described in a progressive manner, with the description of each embodiment focusing on its differences from other embodiments. Reference can be made between the embodiments for their identical or similar parts.

The foregoing description presents merely a few preferred embodiments of the present invention and does not limit the scope thereof in any sense. All changes or modifications made in light of the above disclosure by any person of ordinary skill in the art fall within the scope of protection set forth in the appended claims.

What is claimed is:

1. A pixel structure, comprising a plurality of pixel units arranged in an array, each pixel unit comprising a first sub-pixel, a second sub-pixel, a third sub-pixel and two fourth sub-pixels, the second, third and fourth sub-pixels being arranged to define a quadrilateral encompassing the first sub-pixel, the second, third and fourth sub-pixels being common to four adjacent ones of the pixel units, wherein the second and third sub-pixels in each pixel unit are different in color and the two fourth sub-pixels in each pixel unit are identical to each other.

2. The pixel structure of claim 1, wherein the second and third sub-pixels are located at two opposing apexes of the quadrilateral and the two fourth sub-pixels are located at the other two opposing apexes of the quadrilateral.

3. The pixel structure of claim 2, wherein the first sub-pixel resides on a line segment connecting centers of adjacent second and third sub-pixels, and/or the first sub-pixel resides on a line segment connecting centers of adjacent two fourth sub-pixels.

4. The pixel structure of claim 1, wherein the first, second, third and fourth sub-pixels are all polygons.

5. The pixel structure of claim 1, wherein the first, second, third and fourth sub-pixels are quadrilaterals, hexagons, octagons or any combination thereof.

6. The pixel structure of claim 5, wherein the first sub-pixel is a rectangle, with each of the second, third and fourth sub-pixels being a square.

7. The pixel structure of claim 6, wherein short sides of the first sub-pixel are parallel to the line segment connecting the centers of the adjacent second and third sub-pixels, while long sides of the first sub-pixel are parallel to the line segment connecting the centers of the adjacent two fourth sub-pixels; or the short sides of the first sub-pixel are perpendicular to the line segment connecting the centers of the adjacent second and third sub-pixels, while the long sides of the first sub-pixel are perpendicular to the line segment connecting the centers of the adjacent two fourth sub-pixels.

8. The pixel structure of claim 6, wherein the first, second, third and fourth sub-pixels in one pixel unit are symmetric to corresponding ones in an adjacent pixel unit.

9. The pixel structure of claim 1, wherein the first, second, third and fourth sub-pixels emit light of distinct colors.

10. An OLED display panel, comprising a pixel structure, the pixel structure comprising a plurality of pixel units arranged in an array, each pixel unit comprising a first sub-pixel, a second sub-pixel, a third sub-pixel and two fourth sub-pixels, the second, third and fourth sub-pixels being arranged to define a quadrilateral encompassing the first sub-pixel, the second, third and fourth sub-pixels being common to four adjacent ones of the pixel units, wherein the second and third sub-pixels in each pixel unit are different in color and the two fourth sub-pixels in each pixel unit are identical to each other.

* * * * *